United States Patent [19]

King et al.

[11] Patent Number: 5,763,824

[45] Date of Patent: Jun. 9, 1998

[54] LID ASSEMBLY FOR SHIELDING ELECTRONIC COMPONENTS FROM EMI/RFI INTERFERENCES

[75] Inventors: David Robert King, Elkton, Md.; Bradley E. Reis, Wilmington; Joseph C. Rowan, Hockessin, both of Del.

[73] Assignee: W. L. Gore & Associates, Inc., Newark, Del.

[21] Appl. No.: 735,838

[22] Filed: Oct. 23, 1996

Related U.S. Application Data

[63] Continuation-in-part of Ser. No. 643,292, May 8, 1996.

[51] Int. Cl.[6] ........................................ H05K 9/00
[52] U.S. Cl. ................... 174/35 R; 174/35 GC; 361/816; 361/752; 361/753
[58] Field of Search .................. 174/35 R, 35 GC, 174/51; 361/816, 818, 748, 752, 753, 799, 800; 257/704

[56] References Cited

U.S. PATENT DOCUMENTS

| | | | |
|---|---|---|---|
| 3,885,084 | 5/1975 | Kaiserswerth et al. | 174/35 |
| 3,953,566 | 4/1976 | Gore | 264/288 |
| 4,385,102 | 5/1983 | Fitzky et al. | 429/111 |
| 4,557,957 | 12/1985 | Manniso | 428/36 |
| 4,575,578 | 3/1986 | Bogan et al. | 174/35 |
| 4,857,668 | 8/1989 | Buonanno | 174/35 |
| 4,912,594 | 3/1990 | Bannink, Jr. et al. | 361/218 |
| 4,967,315 | 10/1990 | Schelhorn | 361/424 |
| 5,202,536 | 4/1993 | Buonanno | 174/35 |
| 5,269,810 | 12/1993 | Hull et al. | 607/129 |
| 5,407,865 | 4/1995 | Glovatsky et al. | 437/212 |
| 5,566,055 | 10/1996 | Salvi, Jr. | 361/816 |

FOREIGN PATENT DOCUMENTS

| | | |
|---|---|---|
| 0 560 072 | 2/1993 | European Pat. Off. |
| 0 594 041 | 4/1994 | European Pat. Off. |
| 3520531 | 11/1986 | Germany |
| 92/16095 | 9/1992 | WIPO |
| 96/06520 | 2/1996 | WIPO |

OTHER PUBLICATIONS

Patent Abstracts of Japan vol. 017, No. 009 (E–1303) 8 Jan. 1993 & JP, A, 04 242 010 (Sony Chem Corp) 28 Aug. 1992.

*Primary Examiner*—Kristine L. Kincaid
*Assistant Examiner*—Hung V. Ngo
*Attorney, Agent, or Firm*—Victor M. Genco, Jr.

[57] ABSTRACT

A cover or lid assembly is provided for EMI/RFI shielding. The cover or lid is used in combination with an electrical assembly having an electrical ground, at least one electronic component electrically connected to the assembly, a conductive frame, disposed about the electronic component. The conductive frame is electrically connected to the ground. An electrically conductive adhesive is disposed continuously between the frame and the lid to mount the lid to the conductive frame to shield the electronic component from electromagnetic and radio frequency interference.

9 Claims, 1 Drawing Sheet

LID ASSEMBLY FOR SHIELDING ELECTRONIC COMPONENTS FROM EMI/ RFI INTERFERENCES

CROSS REFERENCE TO RELATED APPLICATION

This application is a continuation-in-part of Ser. No. 08/643,292, filed May 8, 1996.

BACKGROUND OF THE INVENTION

Electromagnetic interference (EMI) has been defined as undesired conducted or radiated electrical disturbances from an electrical or electronic apparatus, including transients, which can interfere with the operation of other electrical or electronic apparatus. Such disturbances can occur anywhere in the electromagnetic spectrum. Radio frequency interference (RFI) is often used interchangeably with electromagnetic interference, which together define the electromagnetic spectrum between 24 kilohertz ($kH_2$) and 240 gigahertz ($GH_2$).

A shield is defined as a metallic or otherwise electrically conductive configuration inserted between a source of EMI/ RFI and a desired area of protection. Such a shield may be provided to prevent electromagnetic energy from radiating from a source. Additionally, such a shield may prevent external electromagnetic energy from entering the shielded system. As a practical matter, such shields normally take the form of an electrically conductive housing which is electrically grounded. The energy of the EMI/RFI is thereby dissipated harmlessly to ground.

Because EMI/RFI disrupts the operation of electronic components, such as integrated circuit (IC) chips, IC packages, hybrid components, and multi-chip modules, various methods have been used to contain EMI/RFI from electronic components. The most common method is to electrically ground a "can", that, will cover the electronic components, to a substrate such as a printed wiring board ("PWB"). As is well known, a can is a shield that may be in the form of a conductive housing, a metallized cover, a small metal box, a perforated conductive case wherein spaces are arranged to minimize radiation over a given frequency band, or any other form of a conductive surface that surrounds electronic components. When the can is mounted on a substrate such that it completely surrounds and encloses the electronic components, it is often referred to as a Faraday cage.

Presently, there are two predominant methods to form a Faraday cage around electronic components for shielding use. A first method is to mechanically secure a can, or other enclosure, with a suitable mechanical fastener, such as a plurality of screws or a clamp, for example. Typically, a conductive gasket material is usually attached to the bottom surface of a can to ensure good electrical contact with the ground strip on the PWB. Mechanically securing a can in this manner facilitates the re-work of electronic components, however, mechanical fasteners are bulky and occupy "valuable" space on a PWB. A second method is to solder a can to a ground strip that surrounds electronic components on a PWB. Although soldering a can provides excellent electrical properties, this method is often labor intensive. Also, a soldered can is difficult to remove if an electronic component needs to be re-worked.

Various methods have been used to make the soldered cans more reworkable. One method is to solder a metal frame to the PWB and then have a metal lid that clips onto the top of the frame. Though this method makes rework relatively easy, it adds additional cost and sacrifices performance, especially in high vibration situations and high frequency applications. Another method is to perforate the edge of the top of the can. The top of the can could then be peeled away from the frame to rework parts inside the can. The additional holes reduce performance, and though the lid is relatively easy to remove, reattachment of the lid requires the labor intensive operation of hand soldering.

Though use of an adhesive to attach a lid to a frame would provide rework advantages, to date, adhesives have not been realistically considered for the attachment of lids onto cans. More particularly, non conductive adhesives permit electromagnetic or RF leakage. Furthermore, an electrically conductive adhesive does not exist that provides adequate electrical properties without resin flow. As is well known, because electrical components are often located very close to a can, any flow of a conductive adhesive may electrically short an electrical component to the can. This is made more difficult by the manufacturing tolerances of the cans and PWBs, which produce parts that are not perfectly flat. The variation of the parts being attached will produce a variable gap between the lid and the frame on the PWB. If enough pressure is applied to ensure the conductive adhesive fills the areas where the gap is great, typically conductive adhesive will flow out from locations where the gap is small.

The foregoing illustrates limitations in existing Faraday cage designs. Thus, it is apparent that it would be advantageous to provide an improved design directed to overcoming one or more of the limitations set forth above. Accordingly, a suitable alternative is provided including features more fully disclosed hereinafter.

SUMMARY OF THE INVENTION

The present invention advances the art of electromagnetic and radio frequency interference (EMI/RFI) shielding beyond which is know to date. In one embodiment of the present invention, a cover, or lid, is in combination with an electrical assembly. The electrical assembly has an electrical ground, at least one electronic component electrically connected to the assembly, and a conductive frame disposed about the electronic component. The conductive frame is electrically connected to the ground. The conductive frame has at least a mounting surface. The cover is comprised of a lid. An electrically conductive adhesive is disposed continuously between the frame mounting surface and the lid. The lid is mounted to the conductive frame, thereby shielding the electronic component from electromagnetic and radio frequency interference.

It is a purpose of the present invention to provide a cover for EMI/RFI shielding that is quickly and easily attached, that provides good electrical grounding, that does not promote shorting to components, and that allows for simple rework of electrical components.

BRIEF DESCRIPTION OF THE DRAWING

The foregoing summary, as well as the following detailed description of a preferred embodiment of the present invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown.

DETAILED DESCRIPTION OF THE INVENTION

Figure 1:
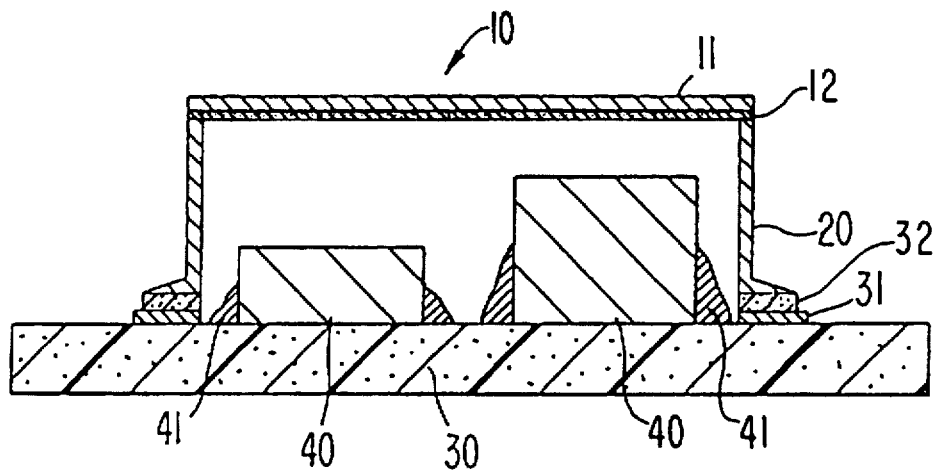
FIG. 1 is a sectional view of one embodiment of the present invention shown attached to a PWB with a conductive adhesive.

As best seen by reference to FIG. 1, a shielding cover, generally illustrated as 10, is provided for EMI/RFI shielding. The shielding cover 10 comprises a lid 11 that may be defined by opposed first and second surfaces. An electrically conductive adhesive 12 is disposed at least about a perimeter of the first surface of the lid 11. The lid 11 is continuously adhesively electrically mounted to the conductive frame 20, by way of the conductive adhesive 12. The conductive frame 20 is electrically connected to an electrical ground 31 of an electrical assembly 30. An electronic component 40 is shielded from electromagnetic and radio frequency interference.

The lid 11 may be formed of a thin metal sheet, such as 0.005 inch nickel plated steel, for example. Other suitable materials may include, but are not limited to copper, aluminum, or steel, for example. It may also be desirable to surface treat the metal with a chromate conversion coating in the case of aluminum, or a nickel, tin or silver plate in the case of copper, steel or aluminum. The desirable properties of the surface treatment would be enhanced resistance to environmental conditions while maintaining electrical conductivity.

The lid 11 can also be constructed from plastic materials formed and metallized in order to provide the desired shape combined with the requisite electrical shielding. Such plastic materials may include, but are not limited to, polyphenylene sulfide, polyamide, acetyl, acetylene-butadiene-styrene terpolymer, polytetrafluoroethylene, polyvinyl chloride, polypropylene, polyethylene, polyethylene terephthalate (PET), polybutyline terephthalate (PBT), polycarbonate, or liquid crystal polymer (LCP). The surface metallization might be provided by electroless plating, evaporation, sputtering, metal paints, laminated metallized shielding, or the like. Metals for the shielding would include, but are not limited to, copper, nickel, silver, gold, aluminum, and the like.

When a plastic material is used for the lid 11, the planar shielding may be provided by the conductive adhesive 12 on its own, eliminating the need for any metal other than the conductive adhesive 12. In this case, the lid 11 would be made entirely of any of the aforementioned plastics without any additional metal coating.

The lid 11 may be formed into any suitable shape, however, generally the lid would be suitably dimensioned to conform to the outline of the frame 20. In one embodiment of the present invention, the lid 11 is substantially planar. The conductive frame defines an enclosure having an open end with a base footprint having a predetermined width. The frame 20 is electrically connected to the electrical ground 31, such as by solder, so that the open end of the frame is positioned over and around the electronic component 40. As should be understood, the shielding cover 10 may define discrete internal compartments such that individual electronic components are individually shielded.

As illustrated in FIG. 1, the electrical assembly 30 may comprise a printed wiring board (PWB). The PWB electrically connects the electronic components 40 which are mounted thereon by a series of electrical contact points 41 to form an appropriate electrical function. The electronic components are normally in the form of leadless packages, through hole packages, gull wing packages, J-lead packages, ball grid arrays, land grid arrays, or pin grid arrays, for example. The contact points 41 are attached to the PWB by means of sockets, solder, conductive adhesives, or any other suitable means.

As illustrated in FIG. 1, the electronic components 40 that need to be shielded from EMI/RFI will be surrounded by an electrical ground strip or ring 31 that is formed as part of the top layer of the PWB. This ground ring will preferably be of a width equal to or greater than the width of the base footprint of the frame 20. The conductive surface of the ground ring may be formed by any conventional method used to manufacture PWBs. The conductive material to form the ring 31 may include, but is not limited to, etched copper or screen printed polymer thick films. It may also be desirable to plate a surface metal, such as nickel, gold, silver or the like, on the conductive surface to enhance resistance to environmental conditions while maintaining electrical conductivity. The ground ring 31 is preferably connected to a ground path of the electrical circuit of the PWB by the means of a circuit trace, plated through hole, or the like.

The frame 20 is electrically and mechanically attached to the ground ring 31, such as by solder 32. The spacing between the ground ring and any electrical contact 41 of a component 40 is such that there is no chance of electrically shorting an electrical contact to either the frame 20 or the solder 32. Preferably, a suitable spacing is about 0.040 inches.

Figure 2:
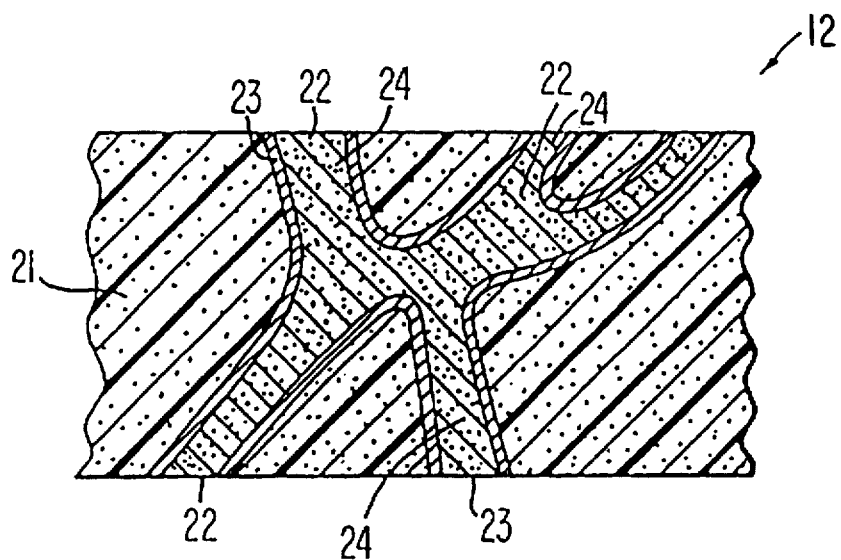
FIG. 2 is an enlarged partial sectional illustration of one embodiment of a suitable conductive adhesive in accordance with the teachings of the present invention.

In a preferred embodiment of the present invention, the conductive adhesive material 12 comprises a substrate 21 which is provided with passageways 22 extending from one side of the substrate to the other and defined by a plurality of walls as shown in FIG. 2. The substrate can be a fabric, a porous membrane, a foam, or the like. Preferably it should be resilient and compressible to provide compliance when used as an adhesive substrate. The fabric can be a woven, nonwoven, knit or the like, provided it has the requisite passageways. Representative fabrics can be polyamide, polytetrafluoroethylene (PTFE), polyester, polyurethane or polyimide, or the like. An especially preferred substrate, for its strength, compressibility, temperature resistance and chemical inertness is porous PTFE.

As the term is used herein porous PTFE shall mean a membrane which may be prepared by any number of known processes, for example, by stretching or drawing processes, by papermaking processes, by processes in which filler materials are incorporated with the PTFE resin and which are subsequently removed to leave a porous structure, or by powder sintering processes. Preferably, the porous PTFE membrane is porous expanded PTFE membrane having a microstructure of interconnected nodes and fibrils, as described in U.S. Pat. Nos. 3,953,566; 4,187,390; and 4,110,392, which are incorporated herein by reference, and which fully describe the preferred material and processes for making them.

The substrate 21 will generally have a thickness ranging from 0.003 inches to about 0.100 inches, and generally will take the form of a sheet, although the shape can be matched to the components that are being bonded together.

The walls of the passageways 22 have adhered to them a continuous conductive metal 23 which can be formed on the walls by an electroless plating procedure. Representative conductive metals include copper, nickel, silver, gold, and the like. The metal coating, or plating, does not fill the passageway volume but only covers the material defining the passageways.

When the substrate is a polymeric fabric such as a polyester fabric, such conductive plated substrates are available from Monsanto Co., under the tradename Flectron materials.

When the substrate is expanded porous PTFE, the conductive plated substrate can be prepared as described generally in U.S. Pat. No. 4,557,957, which is incorporated herein by reference.

Once the conductive metal material is in place on the walls of the passageways, the remaining passageway volume is filled with a nonconductive adhesive resin 24. Suitable adhesive resins include epoxy resin, acrylic resin, urethane resin, silicone resin, polyimide resin, cyanate ester resin, or the like. The adhesive is conveniently imbibed into the passageways by immersing the substrate in a solution of the adhesive. For an epoxy resin adhesive, a suitable solvent is methylethylketone.

The lid 11 may be attached to the frame 20 by placing the conductive adhesive 12 continuously between the lid and the frame, and applying pressure and/or heat to the conductive adhesive to connect both a mounting surface of the frame and a corresponding surface of the lid. A preferred adhesive would use a pressure sensitive adhesive resin that would require only minimal pressure and no additional heat. Depending on the performance needed, however, it might be preferable to use a thermoplastic, snap cure, or thermosetting adhesive resin to attach the protective lid to the frame.

In another embodiment of the present invention, the lid 11 may be defined by a plastic material which has a continuous layer of the conductive adhesive 12 attached to one side. In this embodiment, the conductive adhesive 12 serves as both the metallization for the conductive housing to provide requisite EMI/RFI shielding and as the bonding mechanism for adhesively electrically mounting the protective lid 11 to the frame mounting surface.

EXAMPLE 1

A shielding cover, in accordance with the teachings of one embodiment of the present invention, was made by first laminating a layer of conductive adhesive to a 5 mil thick polyester substrate. The conductive adhesive was a metallized, porous polyester conductive matrix filled with a polybutadiene adhesive resin. The conductive adhesive had a release liner on both sides to facilitate handling. The release liner was removed from one side of the adhesive and the adhesive was placed against the polyester substrate. The polyester substrate and the adhesive were pressed together using a roller at room temperature with hand pressure. The polyester substrate and the adhesive were then laser cut to a pattern which matched the shape of a frame that was already soldered to a PWB. The release liner was removed from the other side of the adhesive and the lid was placed against the top of the frame.

Although an embodiment of the present invention has been described in detail above, those skilled in the art readily appreciate that many modifications are possible without materially departing from the novel teachings and advantages which are described herein. Accordingly, all such modifications are intended to be included within the scope of the present invention, as defined by the following claims.

We claim:

1. A shielding cover in combination with an electrical assembly, said electrical assembly having an electrical ground, at least one electronic component electrically connected to the assembly, and a conductive frame which is disposed about the electronic component and which is electrically connected to said ground, said conductive frame having at least a mounting surface, said shielding cover comprising:

a lid; and an electrically conductive adhesive disposed between the conductive frame and said lid, said electrically conductive adhesive having a substrate having numerous passageways through the substrate, the passageways being defined by a plurality of internal surfaces having disposed thereon a layer of conductive metal, said passageways being at least partially filled with a nonconductive adhesive resin.

2. The device of claim 1, wherein said lid is substantially planar.

3. The device of claim 1, wherein said lid is formed of a metal.

4. The device of claim 3, wherein said lid has a surface treatment to enhance resistance to environmental conditions.

5. A conductive assembly comprising:

a lid having a mounting surface; and an electrically conductive adhesive disposed at least about a perimeter of the mounting surface, said electrically conductive adhesive being defined by a substrate having numerous passageways through the substrate, wherein the passageways are defined by a plurality of internal surfaces covered with a continuous layer of conductive metal, said passageways being at least partly filled with a nonconductive adhesive resin, thereby forming an electrically conductive film which permits electrical current to flow from said lid, through the substrate, to a frame.

6. The device of claim 5, wherein said lid is formed of a metal.

7. The device of claim 6, wherein said lid has a surface treatment to enhance resistance to environmental conditions.

8. An electromagnetic and radio frequency interference shield assembly comprising:

a conductive frame having at least a mounting surface;

a lid attached to said frame mounting surface; and an electrically conductive adhesive disposed between the conductive frame and said lid, said electrically conductive adhesive having a substrate having numerous passageways through the substrate, the passageways being defined by a plurality of internal surfaces having disposed thereon a layer of conductive metal, said passageways being at least partially filled with a nonconductive adhesive resin.

9. The device of claim 1, 5 or 8, wherein said lid is constructed of an unmetallized plastic material and wherein said lid has a continuous layer of said conductive adhesive disposed on one side.

* * * * *